United States Patent
Yang

(10) Patent No.: US 7,057,963 B2
(45) Date of Patent: Jun. 6, 2006

(54) DUAL PORT SRAM MEMORY

(75) Inventor: Hyang-Ja Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/926,441

(22) Filed: Aug. 25, 2004

(65) Prior Publication Data

US 2005/0047256 A1 Mar. 3, 2005

(30) Foreign Application Priority Data

Aug. 25, 2003 (KR) .................. 10-2003-0058641

(51) Int. Cl.
*G11C 8/00* (2006.01)

(52) U.S. Cl. ............... 365/230.05; 365/185.13; 365/189.1; 365/189.04

(58) Field of Classification Search ........... 365/230.05, 365/154, 189.09, 189.04, 189.01
See application file for complete search history.

(56) References Cited

U.S. PATENT DOCUMENTS

| | | | | |
|---|---|---|---|---|
| 6,084,820 A | * | 7/2000 | Raszka | 365/230.05 |
| 6,606,276 B1 | * | 8/2003 | Yamauchi et al. | 365/230.05 |
| 6,731,566 B1 | * | 5/2004 | Sywyk et al. | 365/230.05 |
| 6,829,156 B1 | * | 12/2004 | Marr | 365/154 |

* cited by examiner

*Primary Examiner*—Richard Elms
*Assistant Examiner*—Pho M. Luu
(74) *Attorney, Agent, or Firm*—F. Chau & Associates, LLC

(57) ABSTRACT

The layout structure of a dual port SRAM (Static Random Access Memory) includes a read bit line adjacently positioned to a complementary read bit line, and a write bit line positioned adjacent to a complementary write bit line, to provide a shield between the read and write lines for preventing cross-talk caused during read and write operations.

24 Claims, 13 Drawing Sheets

110

ACTIVE REGION

140

BIT LINE OR POWER SOURCE LINE
(THIRD METAL LINE)

115

GATE LINE

160

FIRST CONTACT

120

FIRST METAL LINE

170

SECOND CONTACT

130

WORD LINE
(SECOND METAL LINE)

180

THIRD CONTACT

DUAL PORT SRAM MEMORY

TECHNICAL FIELD

The present invention relates to a layout in a semiconductor device, and more particularly, to a layout of dual port SRAM in which read and write operations can be performed in a dual mode.

BACKGROUND

Development of semiconductor memory devices has been increasing at a fast pace in recent times because of major breakthroughs in materials, manufacturing processes and designs of semiconductor devices. Semiconductor device manufacturers are constantly enhancing their efforts for more advanced miniaturization, high-integration and capacity increase of the semiconductor devices. This has given an impetus to research and development for more stabilization, higher speeds and smoother operation of semiconductor devices. These results have been brought about by the device makers improving the process techniques, microminiature device techniques and circuit design techniques in the manufacture of semiconductor memory cells such as DRAM (Dynamic Random Access Memory) or SRAM (Static Random Access Memory).

One such advance in the field of SRAM devices has been the development of a dual port SRAM capable of performing a read and write operation at high speeds in place of the conventional single port SRAM. In general, one unit memory cell of a single port SRAM device is composed of six transistors, that is, two load transistors, two drive transistors and two active transistors, to perform the read and write operations sequentially. In contrast, a dual port SRAM device is configured with an addition of two active transistors to the general single port SRAM so as to perform the read and write operations in a dual mode, and which is required to obtain a very high speed operation. However, the dual port SRAM's shortcoming is that the read and write operations interfere with each other to cause a characteristic drop in the semiconductor memory cell since the read and write operations are performed simultaneously.

The layout structure of conventional dual port SRAM will be described next in context of the above-mentioned problems, as follows. FIG. 1 indicates a circuit configuration of dual port SRAM according to the prior art.

Referring to FIG. 1, a single unit of dual port SRAM cell is composed of two load transistors: TL1 and TL2, two drive transistors: TD1 and TD2 and four active transistors: TA1, TA2, TA3 and TA4. First and second load transistors: TL1 and TL2, and first and second drive transistors: TD1 and TD2, are individually connected to form two inverters. The two inverters are cross coupled to create a latch for storing data. A first active transistor TA1 is connected to a read bit line BLR, and a third active transistor TA3 is connected to a write bit line BLW that is positioned adjacently to the read bit line BLR.

A second active transistor TA2 is connected to a complementary read bit line $\overline{BLR}$, and a fourth active transistor TA4 is connected to a complementary write bit line $\overline{BLW}$ that is arranged adjacent to the complementary read bit line $\overline{BLR}$. Further, a read word line WLR is shared with the first active transistor TA1 that is connected to the read bit line BLR, and with the second active transistor TA2 connected to the complementary read bit line $\overline{BLR}$. A write word line WLW is shared with the third active transistor TA3 connected to the write bit line BLW and with the fourth active transistor TA4 connected to the complementary write bit line $\overline{BLW}$.

FIG. 2 is a plan view illustrating a layout structure of a conventional dual port SRAM cell. In FIG. 2, the read bit line BLR and the write bit line BLW are adjacently arranged to constitute a bit line pair 20, and the complementary read bit line $\overline{BLR}$ and the complementary write bit line $\overline{BLW}$ are adjacently arranged to constitute a complementary bit line pair 22.

The dual port SRAM having the above-mentioned configuration performs read and write operations in an independent manner either to write or read data at the same time. This process of reading and writing data is described in detail next.

First, a read operation is discussed. An externally received read address signal is decoded, and according to the decoding result, a word line signal for a read operation is enabled as a logic 'H'. Next, the first and second active transistors, TA1 and TA2, are turned on, and the data stored at the latch 10 is read through the bit line and the complementary bit line. Similarly, in the write operation, a write address signal is received from the outside and is decoded, and according to the decoding result, a word line signal for a write operation is enabled as a logic 'H', and the third and fourth active transistors, TA3 and TA4, are then turned on, and the data loaded on the bit line and the complementary bit line is stored at the latch.

As described above, in a conventional memory structure, a read bit line and a write bit line are adjacent to each other. Further, a complementary read bit line and a complementary write bit line are adjacent to each other. While performing read and write operations, the read operation is influenced by the write operation and the write operation is influenced by the read operation, which means, a cross-talk occurs and brings about a characteristic drop in a dual port SRAM cell. Particularly if the read bit line is adjacent to the write bit line and the complementary read bit line is adjacent to the complementary write bit line, then the problem of crosstalk for read bit line occurs frequently when write operations are carried out.

Further, transistors used in constructing the dual port SRAM cell and individual active regions are not arranged in the same direction, and are positioned distant from one another. Therefore, specific local connection wires are required to connect such distant components. Word lines are also separately configured, and thus require specific local connection wires for a connection between a gate line and a word line and between the respective cells and word lines. Therefore, as the local connection wires for connecting the cell nodes increase, the overall length of wiring increases and also the number of contacts increases simultaneously. Furthermore, the area of circuit layout on a memory chip increases by the increased number of contacts. The increased number of contacts applies a negative influence upon advancing the characteristic features of memory cells.

SUMMARY OF THE INVENTION

A layout structure and method for a dual port SRAM memory that is capable of substantially reducing or preventing cross talk by adjacently disposing read and complementary read bit lines, and by adjacently disposing write and complementary write bit lines is disclosed.

A layout structure and a method for a dual port SRAM memory that is capable of increasing an operating speed and performing a stabilized operation by disposing power source lines between a read bit line pair and a write bit line pair so as to shield the read bit line pair and the write bit line pair is provided.

A layout structure and a method for a dual port SRAM memory that is capable of reducing a well resistance by inserting a well bias into a well region of a semiconductor substrate, and hence preventing a latch-up.

A layout structure and a method for a dual port SRAM memory, in which word lines and gate lines of the respective dual port SRAM cells are connected with each other without specific local connection wires, by individually disposing read and write word lines in one same line is provided.

A layout structure and a method for a dual port SRAM memory is provided that is capable of mutually connecting respective active regions and gate lines by one metal layer through the same direction as the layout of transistors and the respective active regions, the transistors constituting a dual port SRAM cell.

A layout structure of dual port SRAM is disclosed, which includes a read bit line pair for which a read bit line and a complementary read bit line are adjacently positioned along a Y direction of dual port SRAM cell, the read bit line pair being connected to the dual port SRAM cell; and a write bit line pair, which is arranged in parallel with the read bit line pair, and for which a write bit line and a complementary write bit line are adjacently arranged, and which is connected to the dual port SRAM cell. Further, to shield the read bit line pair from the write bit line pair, it is further equipped with power source lines that are positioned between the read bit line pair and the write bit line pair.

A layout structure of dual port SRAM memory is disclosed, which includes read bit line pairs, which are arranged in parallel with one another along a Y direction of dual port SRAM cells based on an intersected matrix type at a crossed point between word lines and bit lines of a row and a column, and which are individually connected to each of the plurality of dual port SRAM cells; write bit line pairs, which are arranged in parallel with one another along the Y direction of the dual port SRAM cells based on the intersected matrix type at the crossed point between the word lines and the bit lines of the row and the column, and which are individually connected to each of the plurality of dual port SRAM cells; and power source lines positioned between the read bit line pair and the write bit line pair in order to shield between the read bit line pair and the write bit line pair are provided.

A layout structure of dual port SRAM, which is provided with a power source line for defining dual port SRAM cells by a Y direction, has a read bit line pair that is connected to one dual port SRAM cell and is positioned adjacent to a read bit line pair connected to a dual port SRAM cell that is adjacent to the dual port SRAM cell. And a write bit line pair connected to the one dual port SRAM cell is positioned adjacently to a write bit line pair connected to a dual port SRAM cell that is adjacent to another side of the dual port SRAM cell.

A layout structure of dual port SRAM has power source lines that are arranged in parallel to and between the read bit line pair and the write bit line pair, the read bit line pairs and the write bit line pairs being connected to each one of a plurality of dual port SRAM cells; read word lines and write word lines, which are positioned below the read and write bit line pairs and the power source lines and are connected to each of the plurality of dual port SRAM cells, and which are arranged vertically to the bit line pairs and are individually formed in one same line; and transistors whose gates and drain and source regions are provided below the read and write word lines, and which are formed in parallel with the read and write bit line pairs.

In at least one embodiment of the present invention, a method of forming a layout of dual port SRAM includes, disposing a read bit line adjacent to a complementary read bit line along a Y direction of a dual port SRAM cell to form a read bit line pair, and individually connecting the read bit lines to the dual port SRAM cells; and adjacently disposing a write bit line and a complementary write bit line to form a write bit line pair in parallel with the read bit line pair, and individually connecting the write bit lines with the dual port SRAM cells. Further, power source lines are formed between the read bit line pair and the write bit line pair, in order to shield between the read bit line pair and the write bit line pair.

BRIEF DESCRIPTION OF THE DRAWINGS

Preferred embodiments of the invention are described with reference to the accompanying drawings, of which.

DETAILED DESCRIPTION OF PREFERRED EMBODIMENTS

The preferred embodiments of the present invention will be described with reference to the appended drawings.

Figure 1:
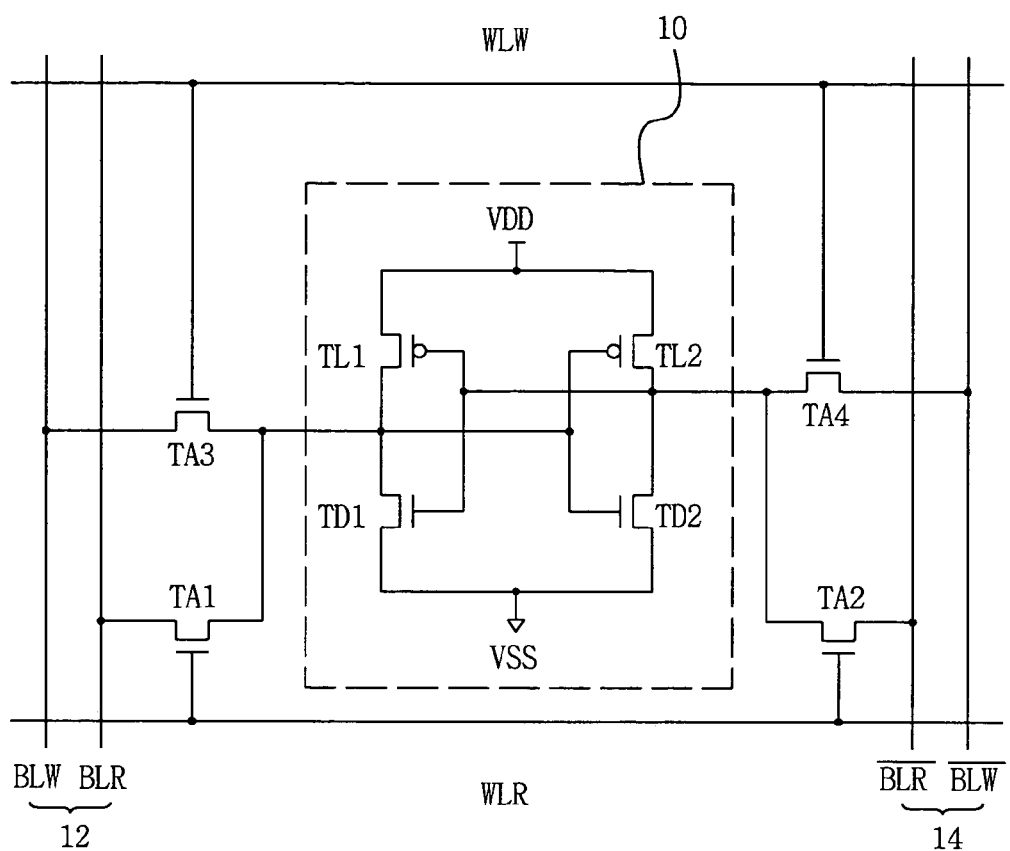
FIG. 1 is a circuit diagram of a conventional dual port SRAM cell.
Figure 2:
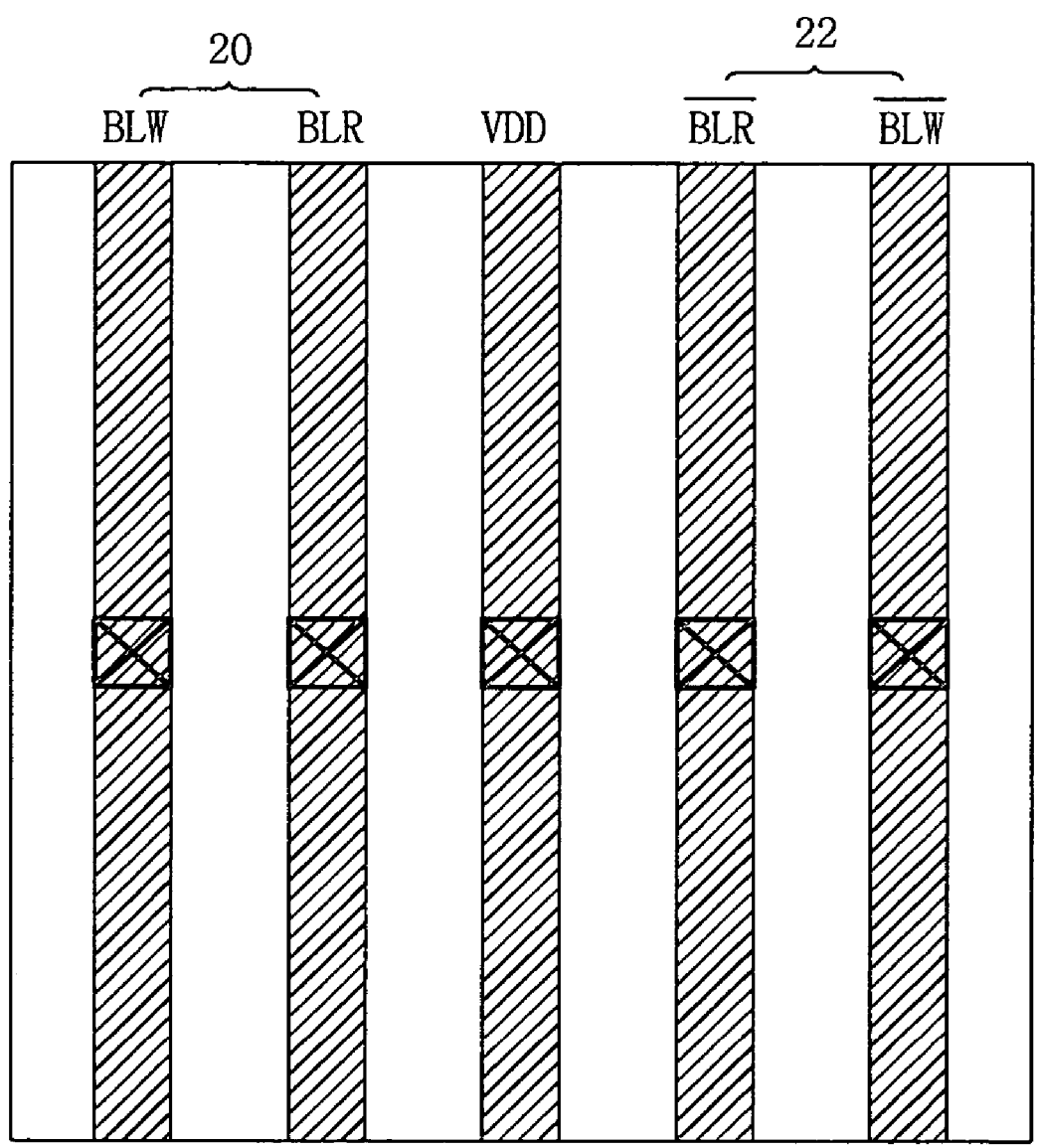
FIG. 2 is a plan view illustrating a layout structure of a conventional dual port SRAM cell.
Figure 3:
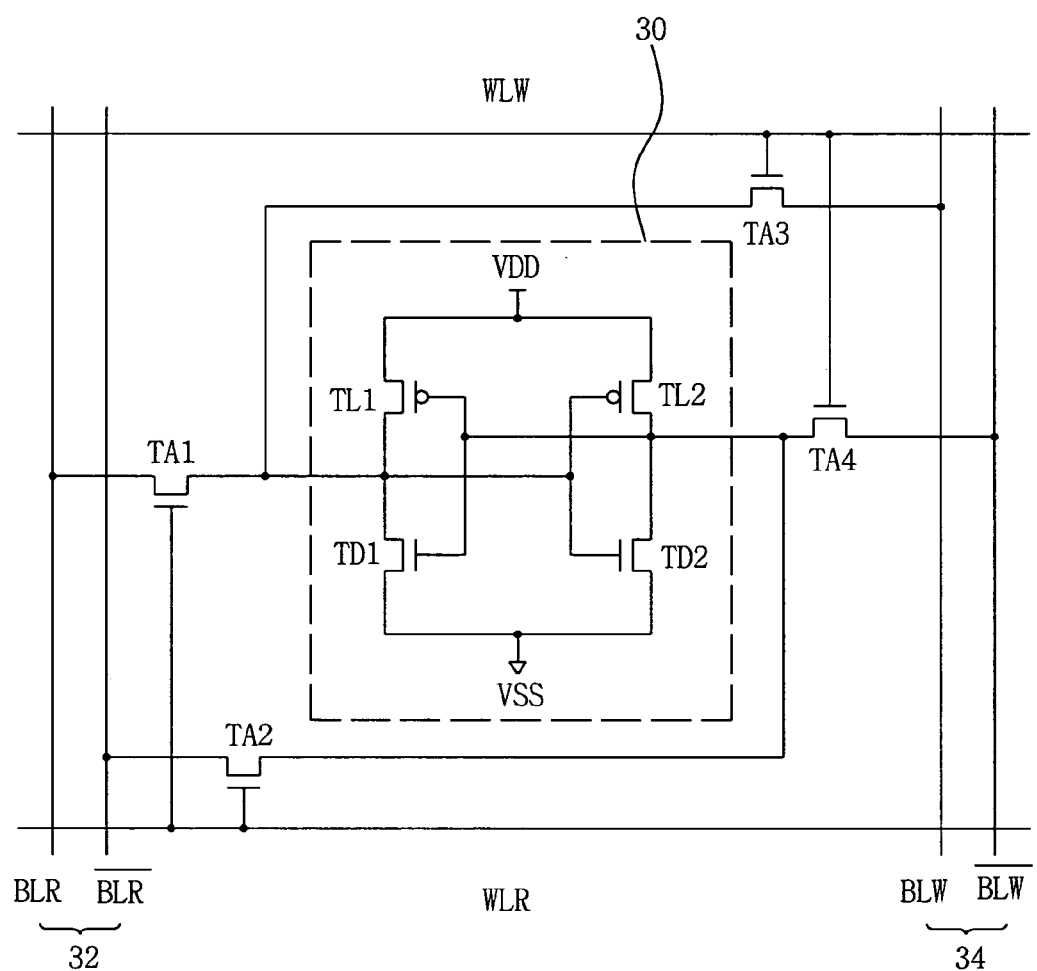
FIG. 3 is a circuit diagram of a dual port SRAM cell according to an embodiment of the present invention.

FIG. 3 shows a circuit configuration of a dual port SRAM cell according to an embodiment of the present invention.

Referring to FIG. 3, in a unit dual port SRAM cell there is a connection configuration of two load transistors: TL1 and TL2; two drive transistors: TD1 and TD2; and four active transistors: TA1, TA2, TA3 and TA4. Two load transistors, TL1 and TL2, are constructed of PMOS transistors. Two drive transistors, TD1 and TD2, and the four active transistors, TA1, TA2, TA3 and TA4, are constructed of NMOS transistors.

First and second load transistors, TL1 and TL2, and first and second drive transistors, TD1 and TD2, are individually connected to thus constitute two inverters. The two inverters are cross coupled to become a latch (30) for storing data. A first active transistor TA1 is connected to a read bit line BLR, and a second active transistor TA2 is connected to a complementary read bit line $\overline{BLR}$ that is adjacent to the read bit line BLR, to perform an access operation of reading the data stored at the latch 30 in response to a word line signal for a read operation.

A third active transistor TA3 is connected to a write bit line BLW, and a fourth active transistor TA4 is connected to a complementary write bit line $\overline{BLW}$ that is positioned adjacent to the write bit line BLW, to perform an access operation of writing data loaded on the write bit line at the latch 30 in response to a word line signal for a write operation. A read word line WLR is shared with the first active transistor TA1, which is connected to the read bit line BLR and with the second active transistor TA2 connected to the complementary read bit line $\overline{BLR}$. A write word line WLW is shared with the third active transistor TA3 connected to the write bit line BLW and with the fourth active transistor TA4 connected to the complementary write bit line $\overline{BLW}$.

As shown in the circuit configuration of FIG. 3, the read bit line BLR and the complementary read bit line $\overline{BLR}$ are positioned adjacently to constitute a read bit line pair 32, while the write bit line BLW and the complementary write bit line $\overline{BLW}$ are adjacently positioned to constitute a write bit line pair 34.

Figure 4:
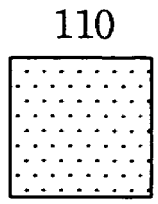
FIG. 4 illustrates layout of a dual port SRAM cell applied to an embodiment of the present invention.
Figure 4:
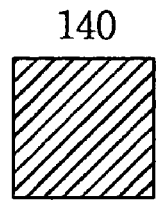
Figure 4:
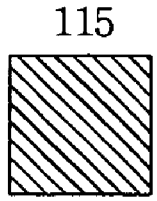
Figure 4:
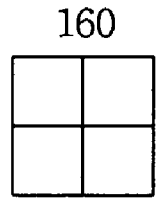
Figure 4:
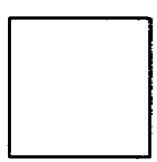
Figure 4:
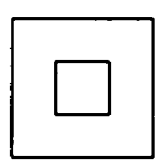
Figure 4:
Figure 4:
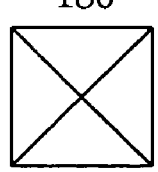

FIG. 4 illustrates layouts applied to an embodiment of the present invention, illustrating the examples of the layout applied to FIGS. 5 to 13. In the layout diagram of the dual port SRAM based on an embodiment of the invention, shown are: an active region 110, a gate line 115, a first metal line 120, a second metal line 130 and a third metal line 140. Further, shown are a first contact 160, a second contact 170 and a third contact 180, to which the active region or the respective lines are connected.

Figure 5:
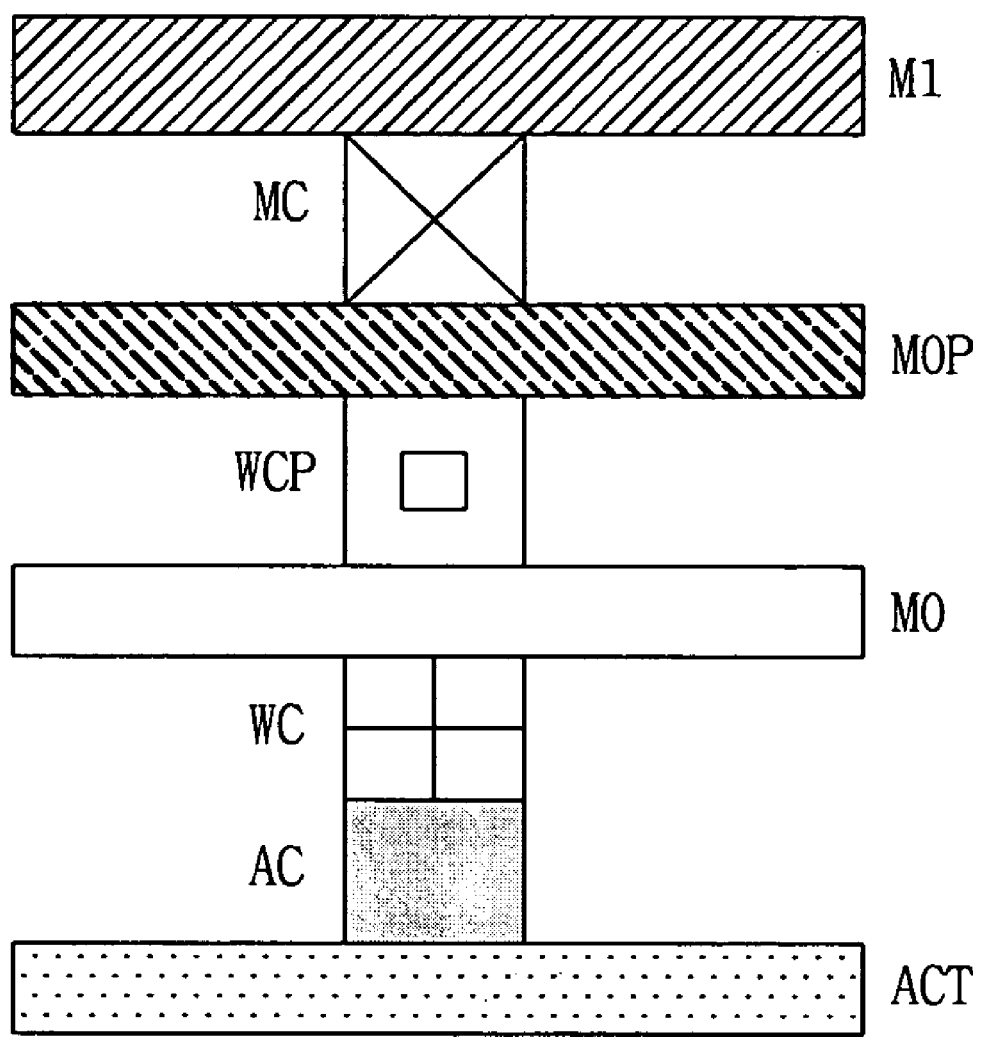
FIG. 5 is a sectional view illustrating a hierarchical structure of simplified layout according to an embodiment of the present invention.

FIG. 5 illustrates a hierarchical structure of simplified layout according to an embodiment of the present invention.

As shown in FIG. 5, in the hierarchical structure of the layout, a third metal layer M1 is positioned in which read and write bit lines are same as power source lines, and below the third metal layer M1, a second metal layer M0P is located in which read and write word lines are same as each other, and below the second metal layer M0P, a first metal layer M0 is disposed.

Further, below the first metal layer M0, an active region ACT of transistors constituting the dual port SRAM cell and gate lines (not shown in FIG. 5) are positioned. Further, a third contact MC is formed to connect between the third metal layer M1 and the second metal layer M0P, and a second contact WCP is formed to connect between the second metal layer M0P and the first metal layer M0. A first contact WC, AC is also formed to connect between the first metal layer M0 and the active region ACT. Besides, the hierarchical structure of FIG. 5 omits an oxide layer and an insulation layer that are indispensably necessary for the process of respective hierarchies.

Though the first contact is arranged as a dual contact WC, AC for the sake of a smooth connection between the first metal layer M0 and the active region ACT, the first contact may be formed as a single contact WC. Though it is not shown in the drawing, the connection contacts WC and AC can be arranged after forming a specific wiring layer between the first metal layer M0 and the active region ACT.

FIGS. 6 to 9 are plan views illustrating hierarchically and sequentially a layout structure for active regions of transistors constituting a unit dual port SRAM cell, gate lines and metal lines according to an embodiment of the present invention. Further, FIG. 10 is a plan view showing a layout structure of a unit dual port SRAM cell according to this embodiment of the present invention, partially illustrating the layout structure of plural dual port SRAM cells.

According to at least one aspect of the present invention, the layout structure of the dual port SRAM in which a read bit line and a complementary read bit line are adjacently positioned to constitute a read bit line pair, that a write bit line and a complementary write bit line are positioned adjacently to constitute a write bit line pair, and that a layout structure of dual port SRAM cells is formed so that the read and write bit line pairs are arranged in parallel with one another along a Y direction of the dual port SRAM cell.

A further aspect is that the power source lines are arranged between the read bit line pair and the write bit line pair to shield between the read bit line pair and the write bit line pair.

Figure 6:
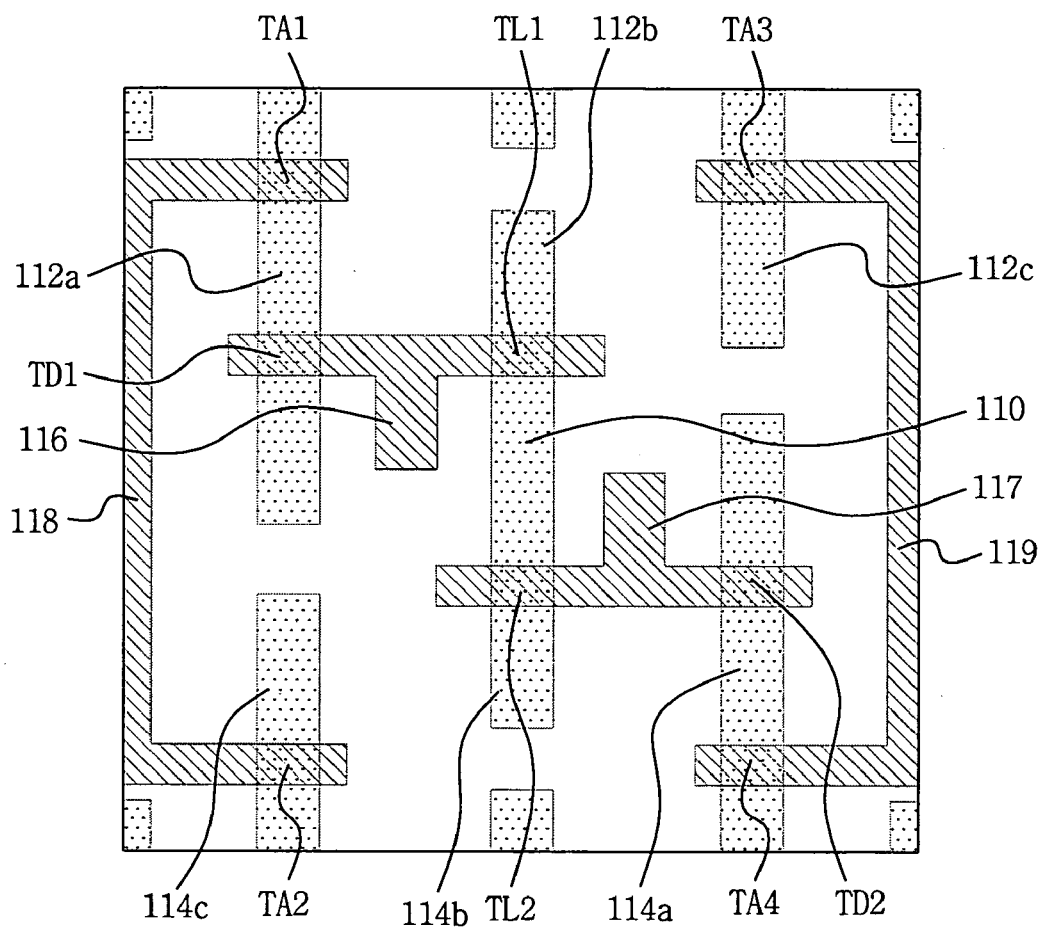
FIGS. 6 to 9 are plan views illustrating hierarchically and sequentially a layout structure of a unit dual port SRAM cell according to an embodiment of the present invention.

FIG. 6 shows a layout structure of two load transistors, TL1 and TL2, two drive transistors, TD1 and TD2, and four active transistors, TA1, TA2, TA3 and TA4, which constitute a unit dual port SRAM cell, and a layout structure of active regions and gate lines of respective transistors.

As shown in FIG. 6, the active regions where the transistors will be formed, are arranged in parallel and distant from each other in the same direction as the Y direction of the dual port SRAM cell. A source region of the first and second load transistors, TL1 and TL2, is constructed of a common source region 110, and a drain region of the first drive transistor TD1 and a drain region of the first active transistor TA1 are constructed of a common drain region 112a, and a drain region of the second drive transistor TD2 and a drain region of fourth active transistor TA4 are constructed of a common drain region 114a.

Though not shown in FIG. 5 for the sake of clearer description, an N-well region is formed below the first and second load transistors TL1 and TL2 constructed of PMOS transistors and the active regions thereof; and a P-well region is formed below two drive transistors, TD1 and TD2, and four active transistors (TA1, TA2, TA3 and TA4) constructed of NMOS transistors and the active regions thereof.

A common gate line 116 of the first load transistor TL1 and the first drive transistor TD1 is arranged in a 'T' shape, and a common gate line 117 of the second load transistor TL2 and the second drive transistor TD2 is arranged in a 'T' shape distant from the common gate line 116 of 'T' shape. Further, a common gate line 118 of the first and second active transistor TA1, TA2 is arranged in a "⊏" shape, and a common gate line 119 of the third and fourth active transistors TA3,TA4 is arranged in a "⊐" shape in parallel with the common gate line of "⊏" shape in an X direction.

As the result of FIG. 6, all the transistors and the active regions are arranged equally toward the Y direction of the dual port SRAM cell, and the common drain region 112a of the first drive and first active transistors TD1 and TA1, a drain region 112b of the first load transistor TL1, and a drain region 112c of the third active transistor TA3 are distantly positioned on one straight line in parallel in the X direction. Also, a common drain region 114a of the second drive and fourth active transistors TD2, TA4, a drain region 114b of the second load transistor TL2, and a drain region 114c of the second active transistor TA2 are positioned on one straight line in parallel in the X direction.

Figure 7:
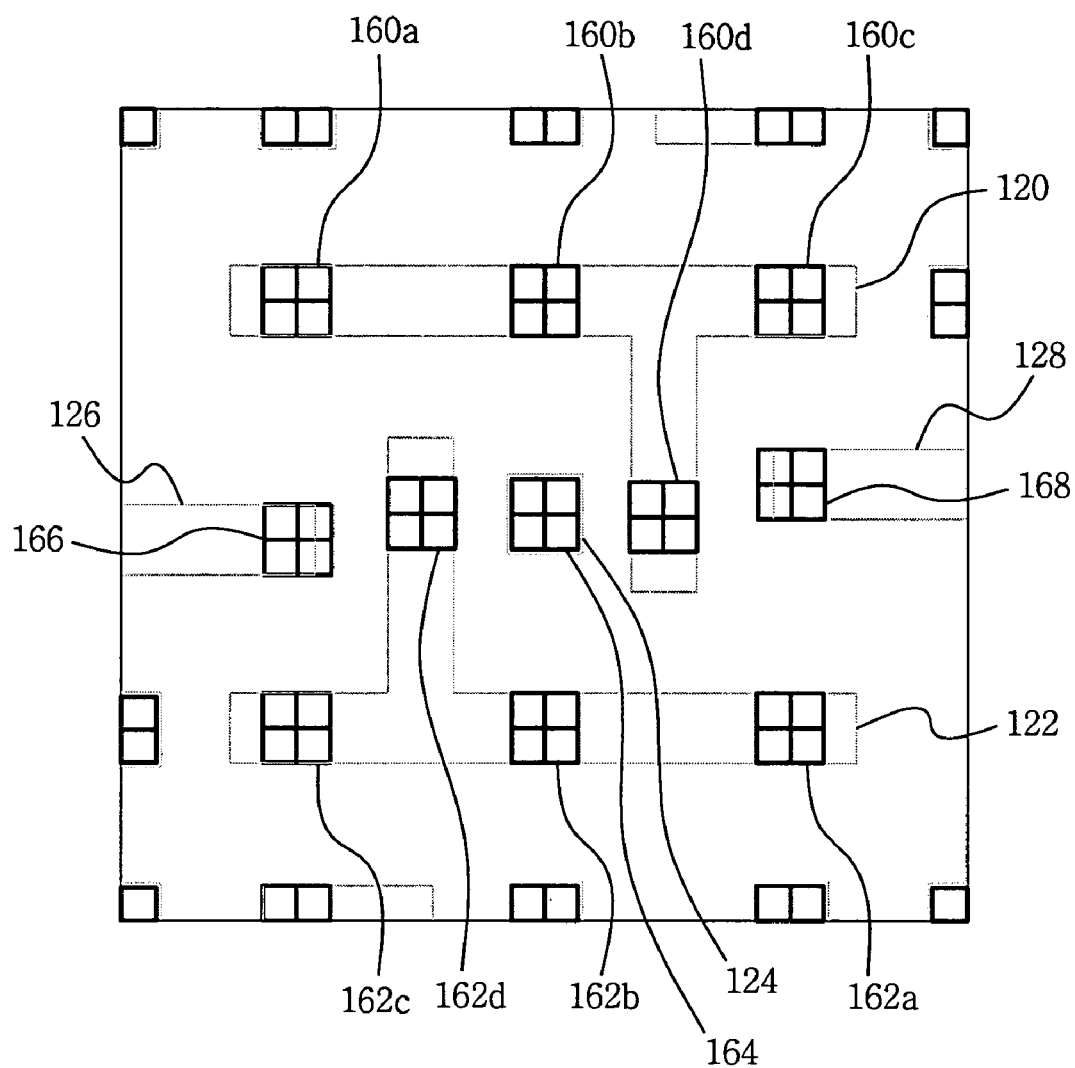

FIG. 7 illustrates a layout structure of first metal lines and first contacts, which constitute a unit dual port SRAM cell according to an embodiment of the invention.

Referring to FIG. 7, the first metal lines are formed same as the metal layer M0 on the active regions and the gate lines of the transistors, and the first contacts are arranged to connect the active regions or the gate lines with the first metal line. In one region 120, among the first metal lines, a contact 160a is formed to be connected to the common drain region 112a of the first active and first drive transistors, and a contact 160b connected to the drain region 112b of the first load transistor is formed. Also, contact 160c connected to the drain region 112c of the third active transistor and a contact 160d connected to the common gate line 117 of the second load and second drive transistors are formed.

In another metal line 122 among the first metal lines, a contact 162a connected to the common drain region 114a of the fourth active and second drive transistors is formed, and a contact 162b connected to the drain region 114b of the second load transistor is formed, and also a contact 162c connected to the drain region 114c of the second active transistor and a contact 162d connected to the common gate line 116 of the first load and first drive transistors are formed. In another metal line 124 among the first metal lines, a contact 164 connected to the common source region 110 of the first and second load transistors is formed, and in another metal lines 126 and 128, contacts 166 and 168 individually connected to the source region of the first and second drive transistors are formed.

Figure 8:
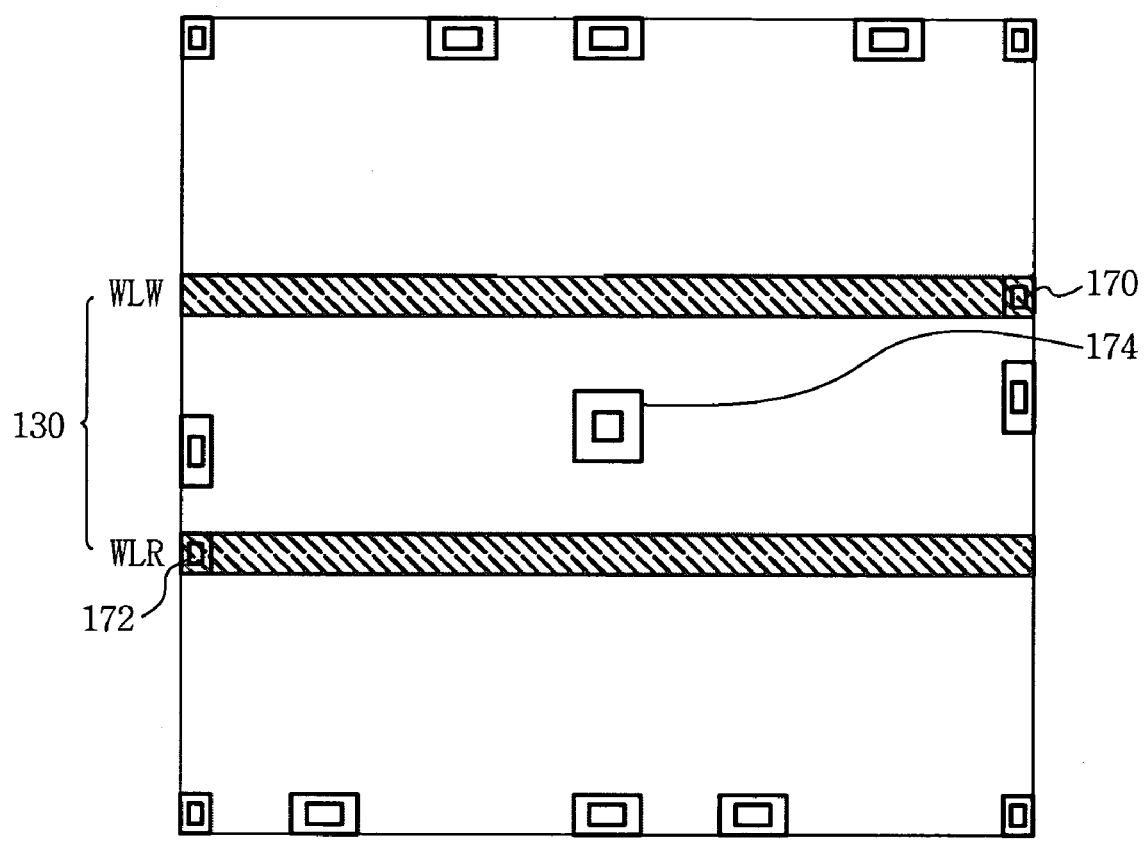

FIG. 8 illustrates a layout structure of word lines that constitute a dual port SRAM cell according to an embodiment of the present invention. With reference to FIG. 8, the word lines are constructed of a word line pair 130 that includes read and write word lines WLR and WLW, and are arranged in parallel and vertically corresponding to the direction of the active regions. Further, the read and write word lines WLR and WLW are positioned on an upper part of the first metal layer M0 and are provided as the same metal layer M0P. The read and write word lines are individually positioned in one same line. In the word line WLR, a contact 172 is formed as being connected to the gate line 118 of the first and second active transistors, TA1 and TA2, for a read operation. In the write word line WLW, a contact 170 is formed with being connected to the common gate line 119 of the third and fourth active transistors TA3 and TA4 for a write operation. Also formed is a contact 174 connected to the common source region 110 of the first and second load transistors TL1 and TL2.

Figure 9:
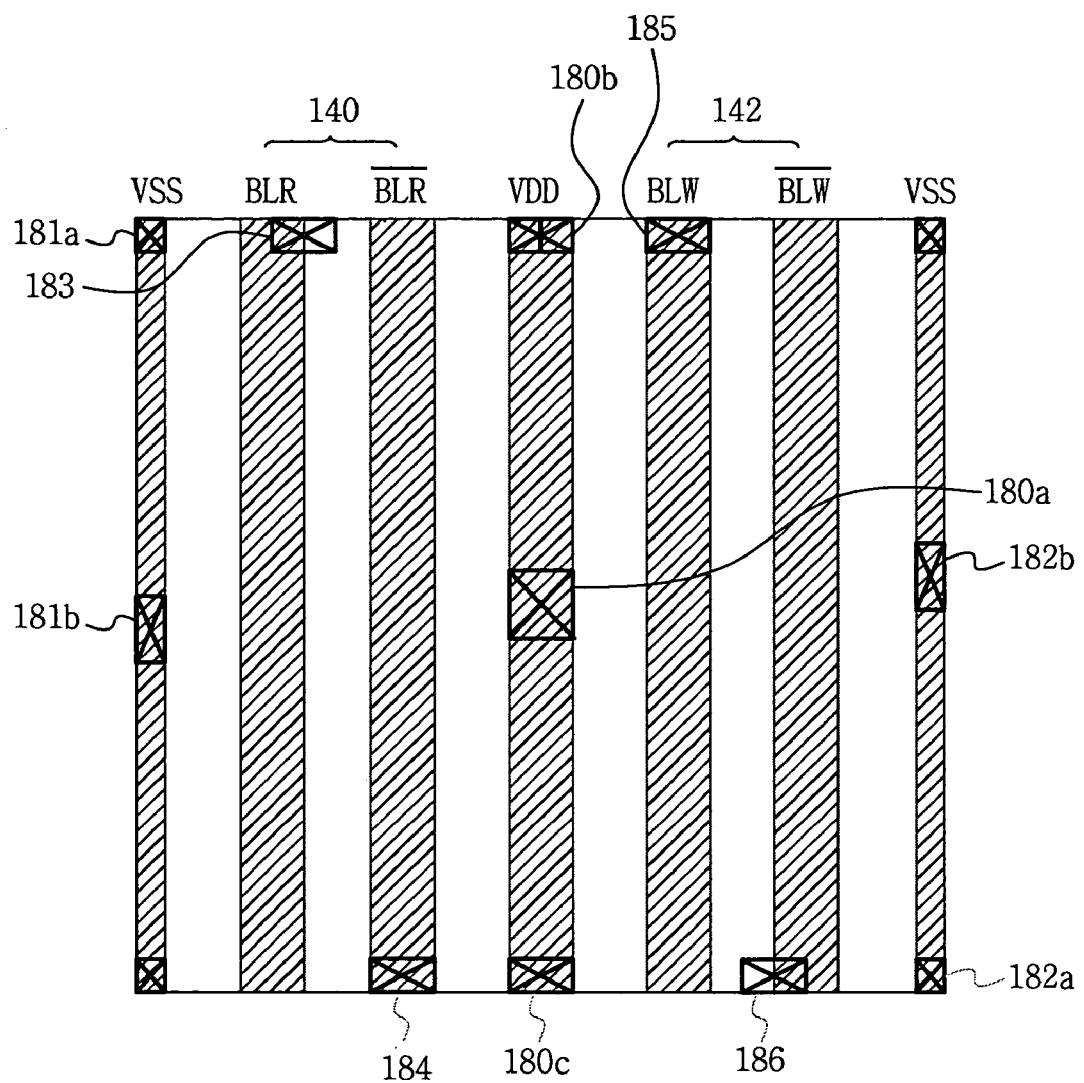
Figure 10:
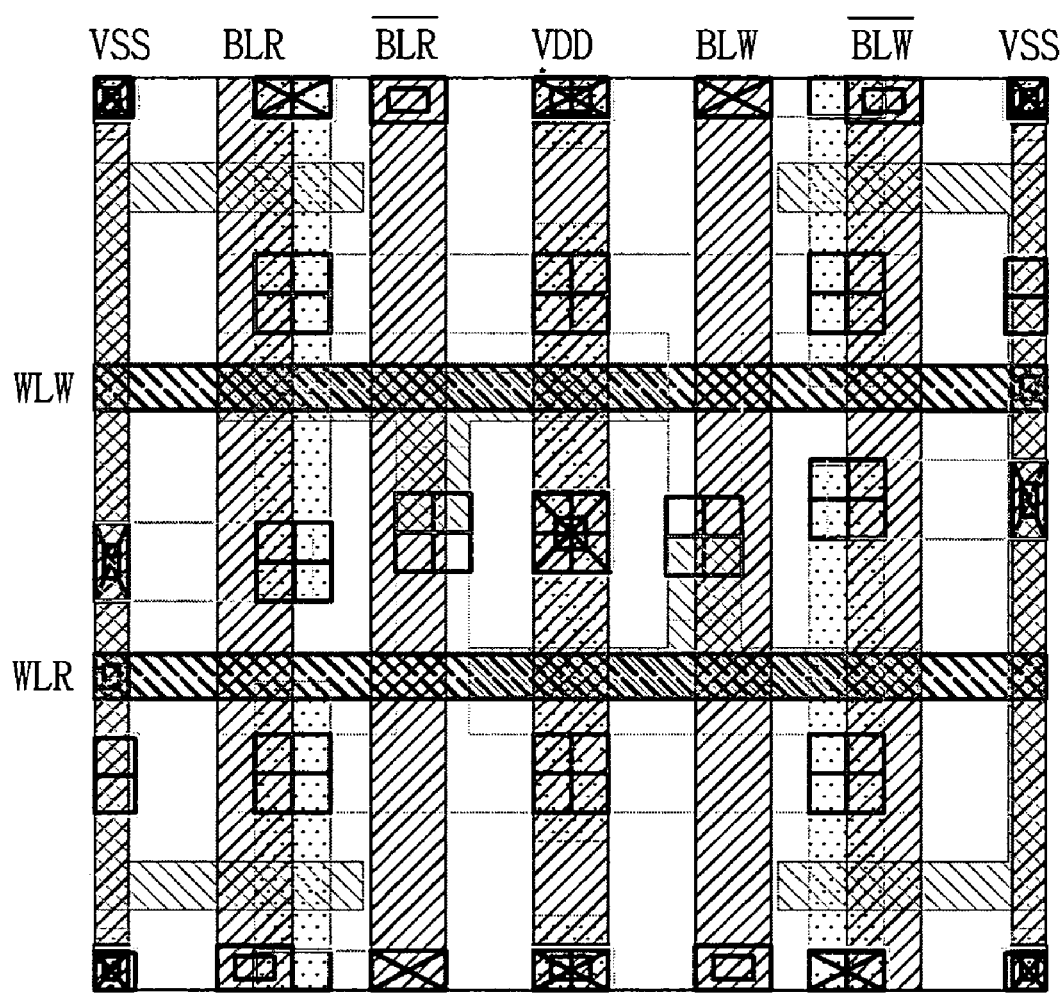
FIG. 10 is a plan view showing a layout structure of a unit dual port SRAM cell according to an embodiment of the present invention.

FIG. 9 illustrates a layout structure of bit line pairs and power source lines, which constitute one dual port SRAM cell, according to an embodiment of the present invention.

Referring to FIG. 9, a read bit line BLR and a complementary read bit line $\overline{BLR}$ are adjacently positioned to constitute the read bit line pair 140. A write bit line BLW and a complementary write bit line $\overline{BLW}$ are positioned adjacent to constitute a write bit line pair 142. The read and write bit line pairs 140, 142 are positioned in parallel and in a horizontal direction with the active regions. In order to shield between the read bit line pair 140 and the write bit line pair 142, power source lines are arranged in parallel with the bit lint pairs 140 and 142 between the read bit line pair and the write bit line pair.

In the power source lines, VDD and VSS lines are alternately positioned. Further, the bit line pairs 140 and 142, and the power source lines VDD, VSS are formed as the same metal layer M1 on the upper part of the word line pair 130, and the bit line pairs and the power source lines are individually positioned in one same line.

In the VDD line, contacts 180b and 180c are formed for inserting at least one N-well bias into the dual port SRAM cell. A contact 180a is connected to the common source region 110 of the first and second load transistors TL1 and TL2. In the VSS line, formed are contacts 181a and 182a for inserting at least one P-well bias into the dual port SRAM cell, and contacts 181b and 182b are connected to source regions of the first and second drive transistors TD1 and TD2.

In the read bit line BLR, a contact 183 connected to a source region of the first active transistor TA1 is formed, and in the complementary read bit line $\overline{BLR}$, a contact 184 connected to a source region of the second active transistor TA2 is formed. In the write bit line BLW, a contact 185 connected to a source region of the third active transistor TA3 is formed, and in the complementary write bit line $\overline{BLW}$, a contact 186 connected to a source region of the fourth active transistor TA4 is formed.

As the result of FIG. 9, in the layout structure, the read bit line is neighboring to the complementary read bit line, and the write bit line is adjacent to the complementary write bit line, and the power source lines are positioned in the same metal layer between the read bit line pair and the write bit line pair. There is further formed a contact for inserting at least one well bias into a unit cell.

FIG. 10 is a plan view illustrating a layout structure of a dual port SRAM cell provided from the layouts hierarchically and sequentially shown in FIGS. 6 through 9, and illustrates a portion of the layout structure for a plurality of dual port SRAM cells. Reference numbers are omitted from FIG. 10 to distinctly represent an embodiment of the present invention, and the reference numbers corresponding to FIG. 10 are equal to those in FIGS. 6 to 9.

With reference to FIG. 10, the source region of the first and second load transistors TL1 and TL2 is provided as the common source region 110, and a drain region of the first drive transistor TD1 and a drain region of the first active transistor TA1 are provided as the common drain region 112a, and a drain region of the second drive transistor TD2 and a drain region of the fourth active transistor TA4 are provided as the common drain region 114a.

Subsequently, arranged is one first metal line 120 in which the contacts 160a, 160b, 160c and 160d are commonly connected with one another, wherein the contact 160a is connected to the common drain region 112a of the first active and first drive transistors, the contact 160b is connected to the drain region 112b of the first load transistor, the contact 160c is connected to the drain region 112c of the third active transistor, and the contact 160d is connected to the common gate line 117 of the second load and second drive transistors.

Further, another first metal line 122 is arranged in which the contacts 162a, 162b, 162c and 162d are commonly connected with one another, wherein the contact 162a is connected to the common drain region 114a of the fourth active and second drive transistors, the contact 162b is connected to the drain region 114b of the second load transistor, the contact 162c is connected to the drain region 114c of the second active transistor, and the contact 162d is connected to the common gate line 116 of the first load and first drive transistors.

Metal lines 126 and 128 are arranged such that the common source region 110 of the first and second drive transistors and the VSS line are connected through the contacts, and further positioned the contact 164 connected to the common source region 110 of the first and second load transistors. The first metal line is positioned on the active regions of the transistors and on the gate lines, and is then positioned on the same metal layer M0.

Next, the read and write word lines WLR and WLW are arranged in parallel in an X direction of the dual port SRAM cell on the first metal lines. The read and write word lines WLR and WLW are formed in the same metal layer M0P, and the read and write word lines are individually positioned in one same line. In the read word line WLR, the contact 172 is formed to be connected to the common gate line 118 of the first and second active transistors for performing a read operation, and in the write word line WLW, the contact 170 is formed to be connected to the common gate line 119 of the third and fourth active transistors for performing a write operation. The contact 174 is formed to be connected to the common source region 110 of the first and second load transistors.

Then, on the read and write word lines WLR and WLW, the read bit line pair 140 that the read bit line BLR and the complementary read bit line $\overline{BLR}$ are positioned adjacent to each other. The write bit line BLW and the complementary write bit line $\overline{BLW}$ are positioned adjacent to each other. The read and write bit line pairs 140 and 142 are arranged in parallel along the Y direction of the dual port SRAM cell.

To shield between the read bit line pair 140 and the write bit line pair 142, the power source lines VDD, VSS are arranged in parallel with the bit line pairs between the read bit line pair and the write bit line pair, and the power source lines are provided by an alternate layout of the VDD and VSS lines.

The bit line pairs 140 and 142 and the power source lines VDD and VSS are positioned on the word line pair, and are formed similar to the metal layer M1. The bit line pairs and the power source lines are individually positioned in one same line. In the read bit line BLR, the contact 183 connected to the source region of the first active transistor TA1 is formed, and in the complementary read bit line $\overline{BLR}$, the contact 184 connected to the source region of the second active transistor TA2 is formed. In the write bit line BLW, the contact 185 connected to the source region of the third active transistor TA3 is formed, and in the complementary write bit line $\overline{BLW}$, the contact 186 connected to the source region of the fourth active transistor TA4 is formed. Next, in the power source line VDD, VSS, arranged are contacts for inserting at least one well bias into the dual port SRAM cell, and the contact 180a connected to the common source region 110 of the first and second load transistors.

In the conventional SRAM memory, the transistors constituting the dual port SRAM cell and the respective active regions are positioned in different directions from each other, and in such a distantly positioned structure, specific and local connection wires are required. The word lines are also configured separately, thus specific and local connection wires are required for a connection between the gate lines and the word lines and for a connection between the word line and respective cells. However, this leads to an increase in the local connection wires for connecting cell nodes, and hence the overall number of wiring processes increases and simultaneously the number of contacts increases.

There is an increase in the overall layout area of the SRAM chip due to such increases in specific and local connection wires. Furthermore, such increase in wiring goes against the general memory design rule of reducing layout space in the memory core. Such an increase in the number of contacts influences the characteristics of memory cell according to the prior art.

Further, in the conventional layout structure of dual port SRAM cell, the read bit line and the write bit line are positioned adjacently, and the complementary read bit line and the complementary write bit line are positioned adjacently. Thus, in the read and write operations, the read operation influences the write operation and the write operation influences the read operation. Such proximity creates a cross talk that brings about a characteristic deterioration of the dual port SRAM cell. Particularly, the influence of write operation generates the cross talk with the read bit line more frequently.

In at least one embodiment of the present invention, the length of transistors constituting the dual port SRAM cell and the respective active regions are arranged in the same direction, and are available for a mutual connection through one metal layer, and thus there is no need to provide a specific local connection wiring process for the mutual connection, and additionally, the read and write operations in the dual port SRAM cells are stabilized and performed smoothly.

Also, the read and write word lines are individually connected with the gate lines of the plurality of dual port SRAM cells in one same line, thus a specific local connection wire for a connection of the word line of respective cells and the gate lines is not necessary. As the number of processes for the local connection wiring is reduced, unnecessary contacts are not formed, and the layout area can be reduced. As a result, a well bias can be inserted into a well region of the semiconductor substrate to lower a well resistance and to prevent a latch-up.

In addition, so as not to interfere with each other between the read and write operation, the read bit line pair that is the read bit line and the complementary read bit line are positioned adjacently. Similarly, the write bit line pair that the write bit line and the complementary write bit line are positioned adjacently. Such adjacent arrangement prevents or controls the cross talk generated in the read and write operation. Further, to shield between the read bit line pair and the write bit line pair, the power source lines are arranged in line with the bit line pairs between the read bit line pair and the write bit line pair, to increase a read and write operating speed and to provide a stabilized operation.

Figure 11:
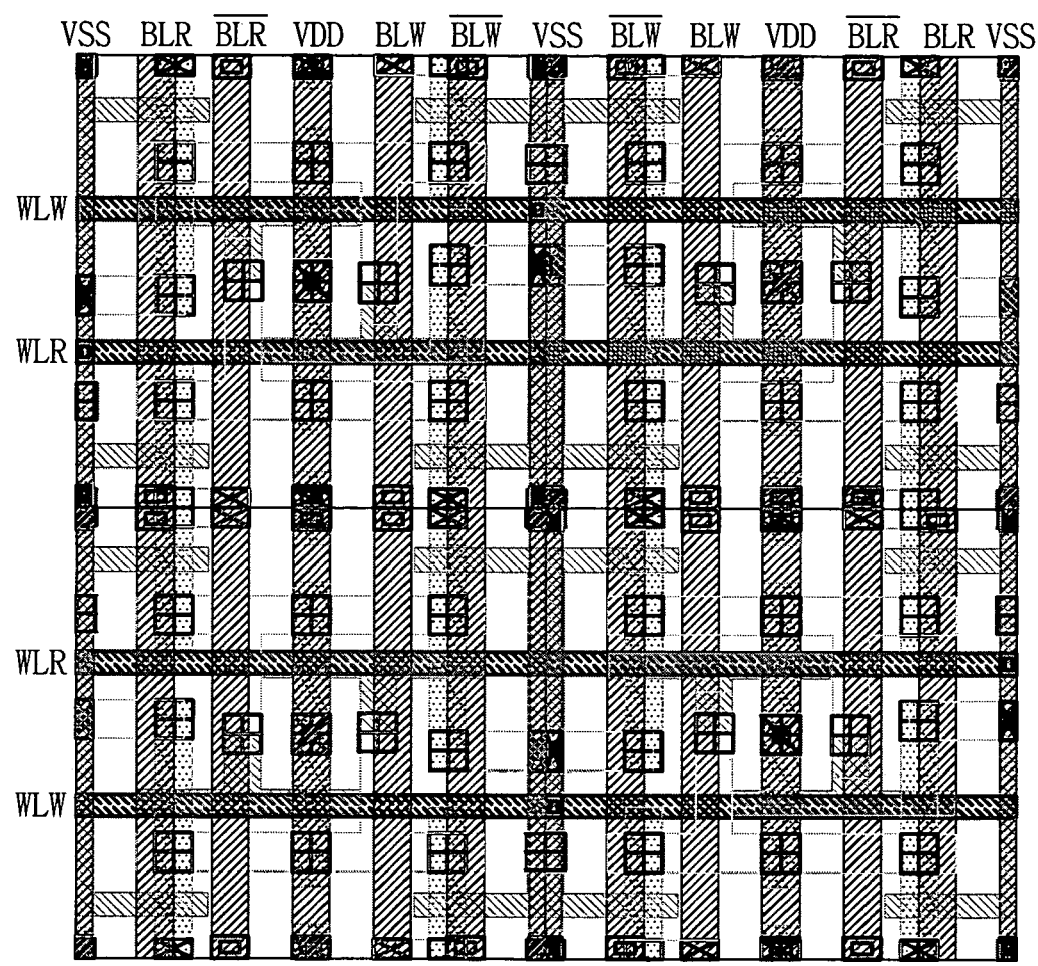
FIG. 11 is a plan view showing a layout structure of plural dual port SRAM cells according to an embodiment of the present invention.

FIG. 11 illustrates a layout structure of the plurality of dual port SRAM cells according to an embodiment of the present invention, in which four dual port SRAM cells are connected with one another.

Referring to FIG. 11, the read bit line pairs, which include the read bit line and the complementary read bit line, are configured adjacently The write bit line pairs include the write bit line and the complementary write bit line are configured adjacently. The power source lines for shielding the read bit line pair and the write bit line pair are intersected between the read bit line pair and the write bit line pair. Further, the read and write word lines are individually positioned in one same line, and are connected with the gate line of respective cells.

Figure 12:
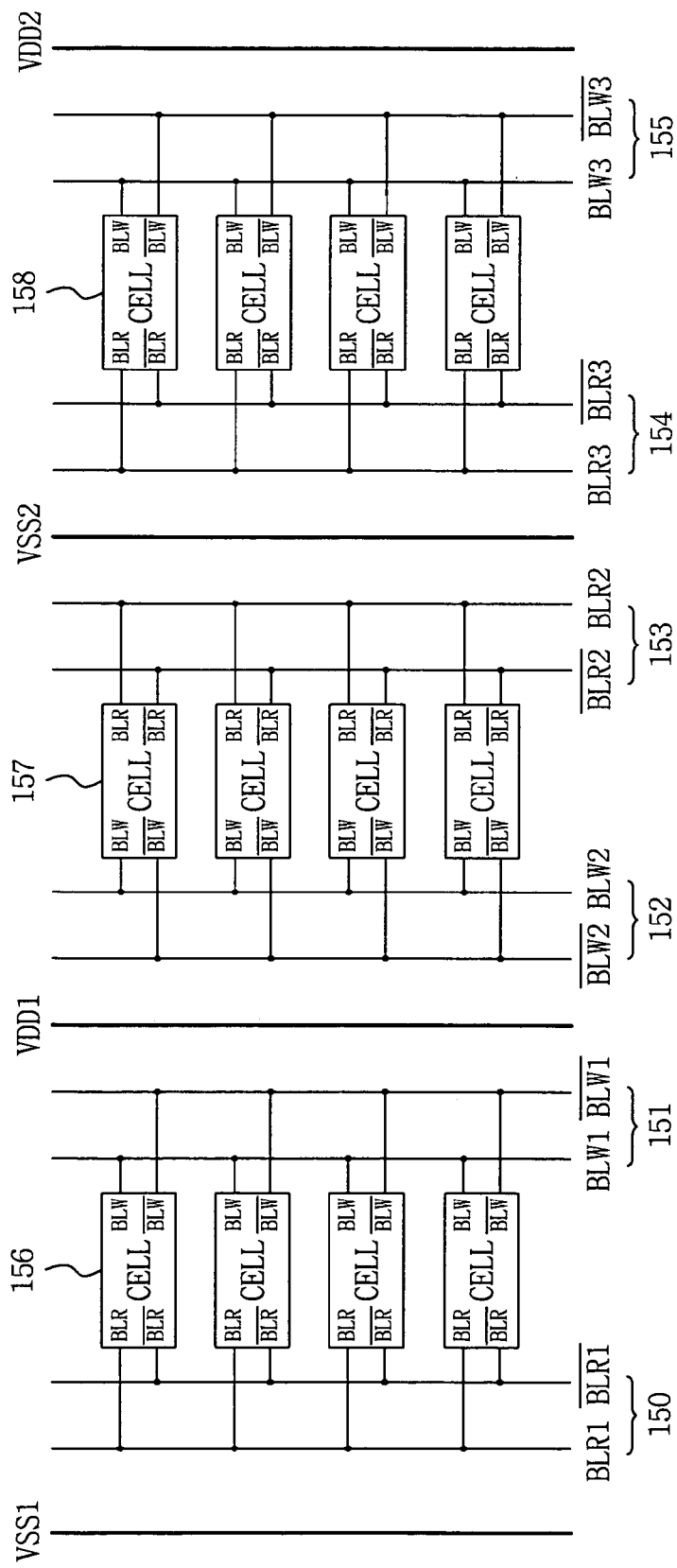
FIG. 12 illustrates an array of the plural port SRAM cells according to an embodiment of the present invention.

FIG. 12 illustrates an array of the plurality of dual port SRAM cells according to an embodiment of the present invention.

With reference to FIG. 12, the read bit line pairs that include the read bit line and the complementary read bit line are adjacently disposed and are connected to each of the dual port SRAM cells, and are arranged in parallel with one another along a Y direction of the dual port SRAM cell. Also, the power source lines are arranged in line with the bit line pairs between the read bit line pair and the write bit line pair, in order to shield between the read bit line pair and the write bit line pair.

A first read bit line pair 153 connected to a first dual port SRAM cell 157 among the plurality of dual port SRAM cells is adjacent to a second read bit line pair 154 connected to a second dual port SRAM cell 158 that is neighboring to the first dual port SRAM cell 157. A first write bit line pair 152 connected to the first dual port SRAM cell 157 is adjacent to a third write bit line pair 151 connected to a third dual port SRAM cell 156.

Figure 13:
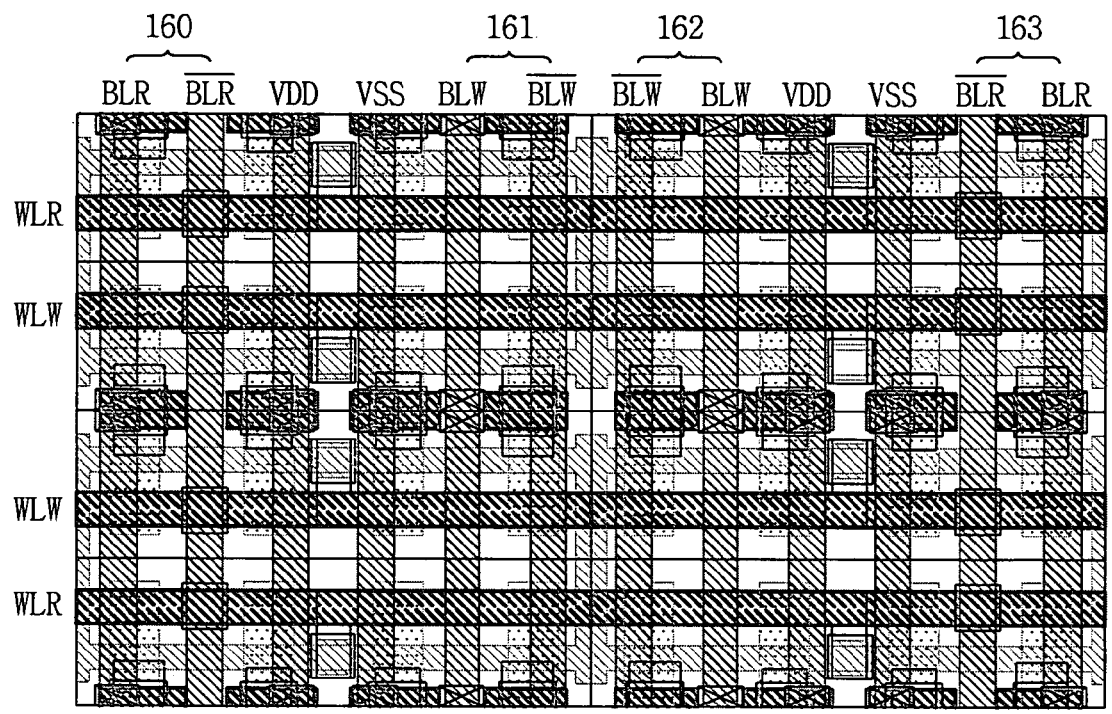
FIG. 13 is a plan view showing a layout structure of plural dual port SRAM cells according to an embodiment of the present invention.

FIG. 13 illustrates a layout structure of the plurality of dual port SRAM cells according to an embodiment of the present invention, and depicts the connection layout structure of four dual port SRAM cells.

As shown in FIG. 13, read bit line pairs 160 and 163 that the read bit line BLR and the complementary read bit line $\overline{BLR}$ are configured to be adjacent. The write bit line pairs 161 and 162 that the write bit line BLW and the complementary write bit line $\overline{BLW}$ are configured to be adjacent, and the power source lines VDD and VSS for shielding the read bit line pair and the write bit line pair are positioned between the read bit line pair and the write bit line pair.

As described above, the read and complementary read bit lines are positioned adjacently, and the write and complementary write bit lines are positioned adjacently, to substantially reduce and prevent a cross talk.

In addition, the power source lines are positioned between the read bit line pair and the write bit line pair to shield the read bit line pair and the write bit line pair, to perform a stabilized operation and to increase the memory operating speed.

A latch-up is also prevented by lowering a well resistance through an insertion of well bias into a well region of semiconductor substrate.

Further, the gate lines and word lines of the respective dual port SRAM cells are connected with one another without specific local connection wires, by individually disposing the read and write word lines in one same line.

Additionally, the reactive regions and the gate lines are connected with one another through one metal layer by disposing the transistors constituting the dual port SRAM cell and the respective regions in the same direction.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A layout structure of dual port SRAM (Static Random Access Memory) in which read and write operations are available in a dual mode, the layout structure comprising:
   a read bit line pair comprising:
     a read bit line and a complementary read bit line that are positioned adjacent to each other along a Y direction of a dual port SRAM cell, said read bit line pair being connected to the dual port SRAM cell;
   a write bit line pair, which is arranged in parallel with the read bit line pair, the write bit pair line comprising:
   a write bit line and a complementary write bit line that are positioned adjacent to each other, and said write bit pair line being connected to the dual port SRAM cell;
   power source lines disposed between the read bit line pair and the write bit line pair; and
   read and write word lines positioned vertically to the read bit line pair and the write bit line pair and formed below the read bit line pair, the write bit line pair and the power source lines.

2. The structure as claimed in claim 1, wherein the power source lines are obtained by alternately disposing a VDD line and a VSS line.

3. The structure as claimed in claim 1, wherein contacts are formed at a crossed portion between a well region of the dual port SRAM cell and the power source lines.

4. The structure as claimed in claim 1, wherein the read and write bit line pairs and the power source lines are formed through a same metal layer.

5. The structure as claimed in claim 1, wherein the read and write word lines are arranged in parallel and are individually formed in one same metal line.

6. The structure as claimed in claim 1, further comprising:
   metal lines for connecting respective active regions and gate lines, below the read and write word lines.

7. The structure as claimed in claim 1, wherein a length of transistors constituting the dual port SRAM cell and corresponding active regions are all arranged in the same direction.

8. The structure as claimed in claim 7, wherein the active regions are arranged in parallel with the read and write bit line pairs.

9. A layout structure of a dual port SRAM memory, comprising:
   read bit line pairs, which are arranged in parallel with one another along a Y direction of dual port SRAM cells, and are individually connected to the dual port SRAM cells;
   write bit line pairs, which are arranged in parallel with one another along the Y direction and which are individually connected to the dual port SRAM cells; and
   power source lines positioned between the read bit line pair and the write bit line pair, wherein the power source lines are obtained by alternately disposing a VDD line and a VSS line between the read bit line pairs and the write bit line pairs.

10. The structure as claimed in claim 9, further comprising:
    contacts for inserting at least one well bias into the power source line every unit cell.

11. The structure as claimed in claim 9, wherein the read and write bit line pairs and the power source lines are formed as the same metal layer.

12. The structure as claimed in claim 9, further comprising read and write word lines, which are connected to the respective dual port SRAM cells and which are positioned vertically below the bit lines and the power source lines.

13. The structure as claimed in claim 12, wherein the read and write word lines are individually formed in one same line and are formed as a same metal layer.

14. The structure as claimed in claim 12, further comprising metal lines for connecting between respective active regions and gate lines through a single metal layer below the read and write word lines.

15. The structure as claimed in claim 14, further comprising transistors for which the respective active regions are formed in the same direction as the read and write bit lines below the metal lines.

16. A layout structure of dual port SRAM memory which is provided with a power source line for defining dual port SRAM cells by a Y direction, said structure comprising:
    a first read bit line pair, connected to a first dual port, SRAM cell is adjacent to a second read bit line pair connected to a second dual port SRAM cell that is adjacent to the first dual port SRAM cell, and a first write bit line pair connected to the first dual port SRAM cell is adjacent to a third write bit line pair connected to a third dual port SRAM cell.

17. A layout structure of dual port SRAM in which write and read operations are available in a dual mode, the structure comprising:
- power source lines, which are arranged in parallel between read bit line pairs and write bit line pairs, said read bit line pairs and the write bit line pairs being connected to a plurality of respective dual port SRAM cells;
- read word lines and write word lines, which are positioned below the read and write bit line pairs and the power source lines, and are connected to the respective dual port SRAM cells, and which are positioned vertically to the bit line pairs and are individually formed in one same line; and
- active regions of transistors whose gates and drain and source regions are provided below the read and write word lines, and which are formed in parallel with the read and write bit line pairs.

18. The structure as claimed in 17, further comprising metal lines for connecting the respective active regions and the gate lines through a single metal layer below the read and write word lines.

19. A bit line layout structure of dual port SRAM in which read and write operations are available in a dual mode, said structure comprising:
- a read bit line pair that includes a read bit line and a complementary read bit line are adjacent;
- a write bit line pair that includes a write bit line and a complementary write bit line are adjacent, are arranged in parallel with each other along a Y direction of a dual port SRAM cell;
- power source lines positioned between the read bit line pair and the write bit line pair; and read and write word lines positioned vertically to the read bit line pair and the write bit line pair and formed below the read bit line pair, the write bit line pair and the power source lines.

20. A method of forming a layout of dual port SRAM in which read and write operations are available in a dual mode, the method comprising:
- disposing a read bit line adjacent to a complementary read bit line along a Y direction of a dual port SRAM cell to form a read bit line pair, and individually connecting the read bit lines to the dual port SRAM cells;
- disposing a write bit line adjacent to a complementary write bit line to form a write bit line pair in parallel with the read bit line pair, and individually connecting the write bit lines with the dual port SRAM cells;
- forming power source lines between the read bit line pair and the write bit line pair; and
- forming read word lines and write word lines vertically to the read bit line pair and the write bit line pair below the read bit line pair, the write bit line pair and the power source lines.

21. The method as claimed in claim 20, further comprising:
- forming contacts for inserting at least one well bias into the power source line every unit cell.

22. The method as claimed in claim 20, wherein said read word lines and write word lines are connected to the respective dual port SRAM cells.

23. The method as claimed in claim 20, further comprising:
- forming metal lines for connecting respective active regions and gate lines through a single metal layer below the read and write word lines.

24. The method as claimed in claim 23, further comprising:
- forming transistors in which the respective active regions are formed in the same direction as the read and write bit lines below the metal lines.

* * * * *